(12) United States Patent
Reinhardt et al.

(10) Patent No.: US 9,099,984 B2
(45) Date of Patent: Aug. 4, 2015

(54) HBAR RESONATOR COMPRISING A STRUCTURE FOR AMPLIFYING THE AMPLITUDE OF AT LEAST ONE RESONANCE OF SAID RESONATOR AND METHODS FOR PRODUCING SUCH A RESONATOR

(71) Applicants: Commissariat A l'Energie Atomique et Aux Energies Alternatives, Paris (FR); Centre National de la Recherche Scientifique, Paris (FR)

(72) Inventors: Alexandre Reinhardt, Saint Martin D'Heres (FR); Sylvain Ballandras, Besancon (FR); Francois Perruchot, Grenoble (FR)

(73) Assignees: Commissariat a l'Energie Atomique et aux Energies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/847,432

(22) Filed: Mar. 19, 2013

(65) Prior Publication Data
US 2013/0249648 A1    Sep. 26, 2013

(30) Foreign Application Priority Data
Mar. 20, 2012  (FR) ...................... 12 52462

(51) Int. Cl.
*H03H 9/00* (2006.01)
*H01L 41/09* (2006.01)
(Continued)

(52) U.S. Cl.
CPC . *H03H 9/17* (2013.01); *H03H 3/04* (2013.01); *H03H 9/02078* (2013.01); *H03H 9/172* (2013.01); *Y10T 29/42* (2015.01)

(58) Field of Classification Search
USPC ................... 310/320, 321; 333/186, 187, 189
See application file for complete search history.

(56) References Cited

U.S. PATENT DOCUMENTS

| | | | | |
|---|---|---|---|---|
| 6,107,721 A | * | 8/2000 | Lakin | 310/321 |
| 6,720,844 B1 | * | 4/2004 | Lakin | 333/189 |

(Continued)

FOREIGN PATENT DOCUMENTS

DE     10 2009 047 807 A1    3/2011

OTHER PUBLICATIONS

Pijolat, M. et al., "High quality factor lithium niobate electrostrictive HBAR resonators," Frequency Control and the European Frequency and Time Forum (FCS), 2011 Joint Conference of the IEEE International, IEEE (May 2, 2011), pp. 1-3, XP032009268.

(Continued)

*Primary Examiner* — Thomas Dougherty
(74) *Attorney, Agent, or Firm* — Baker Hostetler LLP

(57) ABSTRACT

An HBAR resonator comprises, on a substrate, a piezoelectric transducer, said transducer comprising at least one piezoelectric layer, at least two series of electrodes and exhibiting resonance frequencies Fi corresponding to wavelengths λi, characterized in that it comprises an amplification structure comprising at least one resonant cavity arranged on the substrate between said transducer and said substrate or in said substrate, this amplification structure being suitable for mechanically resonating at least one of the resonance frequencies Fi of said transducer corresponding to said wavelength λi, so as to amplify the amplitude of the electrical resonance generated at said frequency.

12 Claims, 17 Drawing Sheets

(51) Int. Cl.
*H03H 9/17* (2006.01)
*H03H 9/02* (2006.01)
*H03H 3/04* (2006.01)

(56) References Cited

U.S. PATENT DOCUMENTS

| | | | |
|---|---|---|---|
| 7,535,324 B2* | 5/2009 | Fattinger et al. | 333/189 |
| 7,663,451 B2* | 2/2010 | Dal Molin | 333/133 |
| 2004/0145430 A1* | 7/2004 | Metzger | 333/187 |
| 2005/0206476 A1* | 9/2005 | Ella et al. | 333/133 |
| 2006/0119453 A1* | 6/2006 | Fattinger et al. | 333/189 |
| 2008/0258845 A1* | 10/2008 | Schmidhammer | 333/195 |
| 2008/0297280 A1* | 12/2008 | Thalhammer et al. | 333/189 |
| 2013/0038408 A1* | 2/2013 | Burak et al. | 333/187 |
| 2013/0335166 A1* | 12/2013 | Sinha et al. | 333/144 |

OTHER PUBLICATIONS

Pijolat, M. et al., "LiNbO3 Film Bulk Acoustic Resonator," Frequency Control Symposium (FCS), 2010 IEEE International, IEEE, Piscataway, NJ, US, (Jun. 1, 2010), pp. 661-664, XP031738433.

Reinhardt, A., on "Simulation, conception et realization de filtres á ondes de volume dans des couches minces piézoélectriques," Thèse, pour l'obtention du Doctorat de l'"Universite de Franche-Comté, Jul. 7, 20115,U.F. R des Sciences et Techniques, Université de Franche, pp. 1-212.

* cited by examiner

US 9,099,984 B2

HBAR RESONATOR COMPRISING A STRUCTURE FOR AMPLIFYING THE AMPLITUDE OF AT LEAST ONE RESONANCE OF SAID RESONATOR AND METHODS FOR PRODUCING SUCH A RESONATOR

CROSS-REFERENCE TO RELATED APPLICATION

This application claims priority to foreign French patent application No. FR 1252462, filed on Mar. 20, 2012, the disclosure of which is incorporated by reference in its entirety.

FIELD OF THE INVENTION

The field of the invention is that of bulk wave resonators operating with high harmonic modes (HBAR, standing for High-overtone Bulk Acoustic Resonator). Such resonators exhibit quality factors that are very high at frequencies of the order of a few GHz. Their use is envisaged in oscillation loops intended for frequency synthesis or ultra-stable time standards.

BACKGROUND

Currently, the resonators of HBAR type derive from the uses of high order harmonics, which can range from 10 to 100 times the fundamental frequency of said resonator, in bulk wave resonators such as the quartz resonators for example. Their initial application was to make it possible to limit the decrease in the electromechanical coupling factor of a composite resonator made up of a piezoelectric layer, its electrodes, and an additional layer providing for a mechanical support, a temperature compensation, or even simply the fabrication of the resonator.

When the substrate becomes very thick relative to the piezoelectric layer, the resonator becomes an HBAR or OMR (Overmoded Resonator) resonator rather than a composite resonator. These resonators have applications in fields where high quality factors are needed. In practice, resonators consisting of a thin film on a bulk substrate of a material exhibiting low propagation losses, such as quartz as described in the paper by H. Zhang, W. Pang, H. Yu and E. S. Kim, entitled *High-tone bulk acoustic resonators on sapphire, crystal quartz, fused silica and silicon substrates*, J. Appl. Phys. Vol. 99, 124911 (2006), YIG (Ytrium Ion Garnet), lithium tantalate as described in the paper by H. L. Salvo, M. Gottlieb and B. R. McAvoy, entitled *Shear mode transducers for high-Q bulk microwave resonators*, in Proceedings of the 41$^{st}$ Annual Frequency Control Symposium, p. 388-390 (1982), lithium niobate as described in the paper by D. Gachon, E. Courjon, J. Masson, V. Petrini, J. Y. Rauch, S. Ballandras, entitled *LiNbO3-LiNbO3 high overtone bulk acoustic resonator exhibiting high Q.f product*, in Proceedings of the 2007 IEEE Ultrasonics Symposium, p. 1417-1420, corindon as described in the paper by K. M. Lakin, G. R. Kline and K. T. McCarron, entitled *High-Q microwave acoustic resonators and filters*, IEEE Transactions on Microwave Theory and Techniques, vol. 41 No. 2, p. 2139-2146 (1993) or sapphire as described in the paper by G. R. Kline, K. M. Lakin and K. T. McCarron, *Overmoded high-Q resonators for microwave oscillators*, in Proceedings of the 1993 IEEE International Frequency Control Symposium, p. 718, make it possible to obtain very high quality factors at relatively high frequencies (up to more than 30 000 at 2 GHz).

In this configuration, illustrated in FIG. 1, the thin piezoelectric film $P_{iezo}$, inserted between a top electrode Es and a bottom electrode Ei, acts as both an excitation and reception transducer, while the properties of propagation of the acoustic wave $O_{ac}$ in the substrate S are exploited. To obtain high quality factors, it is therefore necessary to employ harmonics of a high order in order for the transducer to occupy only a small portion of the complete resonator and thereby be only little involved in the length of propagation of the wave.

This type of resonator offers the advantage of using substrates made of material with low losses and therefore high quality factor.

The drawback however is that the frequency spectrum of such a resonator consists of a series of evenly spaced resonances, the difference in frequency between these resonances corresponding to the fundamental resonance frequency of the component, as a first approximation primarily defined by the thickness of the substrate and the speed of propagation of the waves therein. Such a spectrum is represented in FIG. 2 for the case of an AlN/silicon resonator which provides the electrical response of an HBAR resonator, in terms of normalized conductance as a function of frequency.

The multitude of resonances, spaced apart by a few MHz only for substrates of the order of 500 µm to 1 mm in thickness, is problematic for time standard applications, because the oscillator circuits can indiscriminately be set to oscillate on one or the other of the resonances and thus produce an a priori random frequency. Jumps from one frequency to the other can even occur in the case of very significant instabilities.

To overcome these problems, a number of solutions have been proposed in the literature.

A first method consists in increasing the spacing between the resonances of the HBAR. This difference is defined as a first approximation by the relationship:

$$\Delta f \approx \frac{V}{2e}$$

in which V is the speed of the acoustic wave exploited in the substrate and e is the thickness thereof. Since the speed of propagation is an intrinsic characteristic of the material, the only way to increase the frequency difference Δf is to reduce the thickness of the substrate. As an example, FIG. 3 presents the theoretical effect of the thinning of the substrate of an AlN/sapphire resonator from 400 to 25 µm.

In this case, the periodicity of the resonances changes from 14 to 224 MHz. With such a frequency difference, the risks of frequency jumps from one resonance to the other are greatly limited, all the more so as the elements of the oscillation circuit generally have a limited bandwidth and therefore a tendency to attenuate the unused resonances. Another advantage of this method is that it makes it possible, as shown by the curves of FIGS. 3a and 3b which illustrate the trend of the conductance and of the susceptance as a function of the frequency respectively in the cases of HBAR resonators of AlN with a thick substrate (400 µm) and a thin sapphire substrate (25 µm), to increase the amplitude of the resonance peaks, and therefore better define them, because of an increase in the electromechanical coupling factor of the different resonances. This factor, which represents the capacity of the component to convert electrical energy into mechanical energy, and vice-versa, is in fact greatly limited by the presence of a thick substrate, which contributes only to the storage of mechanical energy, but not to its restoration in electrical form.

Despite these advantages, this solution does, however, suffer from two major drawbacks:

by reducing the thickness of the substrate, the proportion taken by the volume of the transducer and of the electrodes, and therefore the contribution of the layers having relatively low mechanical quality factors, are increased: for great thickness reductions, a significant degradation of the quality factor of the resonances is noted;

moreover, although thinning solutions do exist for materials like silicon or quartz, they are difficult to implement for materials such as lithium niobate where problems of parallel alignment between the eroded face and the native face arise (as described in the paper by M. Pijolat, S. Loubriat, S. Queste, D. Mercier, A. Reinhardt, E. Defaÿ, C. Deguet, L. Clavelier, H. Moriceau, M. Aïd and S. Ballandras, entitled *Large electromechanical coupling factor film bulk acoustic resonator with X-cut $LiNbO_3$ layer transfer*, Appl. Phys. Lett. 95, 182106 (2009)), but also problems of generation of crystalline defects in the thinned materials. These two effects both contribute to an even greater degradation of the quality factor of the component. Moreover, for some materials such as sapphire or diamond, the thinning methods are virtually non-existent.

The other approaches described in the literature propose circumventing these problems by adding a filtering structure to the resonators. For example, authors have proposed producing bulk wave bandpass filters co-integrated with HBAR resonators as described in the paper by W. Pang, H. Zhang, J. J. Kim, H. Yu and E. S. Kim, entitled *High-Q single mode high-tone bulk acoustic resonator integrated with surface-micromachined FBAR filter*, Proceedings of the 2005 MTT-S International Microwave Symposium, p. 413. These filters are produced from resonators obtained by the same technological steps of electrode and piezoelectric layer deposition, but on top of a locally positioned sacrificed layer that is removed at the end of fabrication to leave the resonators that make up the filter acoustically isolated from the substrate by a blade of air, as shown in FIG. 4. The bandpass filter selects only one or more resonances and greatly attenuates the others. However, in practice, the quality factors obtained have proven to be relatively low (3600 at 2.5 GHz), because of the additional electrical losses brought about by the presence of the filter as described in the paper by W. Pang, H. Zhang, J. J. Kim, H. Yu and E. S. Kim, entitled High-Q single mode high-tone bulk acoustic resonator integrated with surface-micromachined FBAR filter, Proceedings of the 2005 MTT-S International Microwave Symposium, p. 413.

SUMMARY OF THE INVENTION

In this context, the Applicant proposes a novel HBAR resonator design that makes it possible to select a particular resonance of an HBAR resonator in order to favour its insertion in an oscillation circuit. To do this, the Applicant started from the observation that the envelope of the response of an HBAR resonator reflects the distribution of the acoustic fields in the piezoelectric layer as described in the publication by A. Reinhardt, entitled *Simulation, conception et réalisation de filtres á ondes de volume dans des couches minces piézoélectriques* [Simulation, design and production of bulk wave filters in thin piezoelectric layers], Université de Franche-Comté thesis (2005). This includes two major contributions which are:

the distribution of the fields: the electromechanical coupling factor of the component is maximum when the thickness of the piezoelectric layer corresponds to a half-wavelength of the bulk wave used, or, by default, corresponds to an odd multiple of this half-wavelength. Now, the amplitude of the resonance peaks is directly proportional, among other things, to the electromechanical coupling factor of the resonator. This phenomenon is, for example, responsible for the envelope of the resonance peaks that can be seen in FIG. 2 and which represents a maximum in the region of 2.5 GHz;

the quantity of charges generated by the piezoelectric material is directly proportional, given equal structure, to the amplitude of the mechanical fields in the piezoelectric layer. Consequently, the value of the admittance or of the impedance that the resonator obtains is directly linked to the amplitude of the fields generated in the piezoelectric layer.

Thus, and more specifically, the subject of the present invention is an HBAR resonator comprising, on a substrate, a piezoelectric transducer, said transducer comprising at least one piezoelectric layer, at least two series of electrodes and exhibiting resonance frequencies Fi corresponding to wavelengths λi, characterized in that it comprises an amplification structure comprising at least one resonant cavity arranged on the substrate between said transducer and said substrate or in said substrate, this amplification structure being suitable for mechanically resonating at least one of the resonance frequencies Fi of said transducer corresponding to said wavelength λi, so as to amplify the amplitude of the electrical resonance generated at said frequency.

Generally, the resonant cavity can be defined as being a single-layer or multilayer structure exhibiting an acoustic transmission spectrum characterized by relatively low levels, typically being able to be less than approximately 0.5, and over a wide frequency range bracketing the working frequencies Fi, but with localized transmission peaks at the frequency Fi of interest.

The resonant cavity can equally be defined as being a single-layer or multilayer structure, the total thickness of which is a multiple (even or odd) of a half-wavelength λi.

It is even possible to combine these two types of definition.

According to a variant of the invention, the resonant cavity has a thickness substantially equal to nλi/2 with n being a non-zero integer.

According to a variant of the invention, the amplification structure additionally comprises at least one basic mirror structure reflecting at said frequency Fi.

According to a variant of the invention, the transducer comprises a series of bottom electrodes and a series of top electrodes.

According to a variant of the invention, the transducer comprises two series of top electrodes.

According to a variant of the invention, said resonant cavity comprises a layer of thickness substantially equal to nλi/2 with n being a non-zero integer.

According to a variant of the invention, said resonant cavity is defined in said substrate, and is delimited by basic mirror structures reflecting at said frequency Fi buried in said substrate, these structures forming part of said cavity.

According to a variant of the invention, the resonant cavity comprises a layer of $SiO_2$.

According to a variant of the invention, said resonant cavity comprises a succession of alternate layers of variable porosity.

According to a variant of the invention, the substrate is made of sapphire, or of quartz, or of lithium niobate, or of lithium tantalate, or of corindon or of silicon, or of germanium or of gallium arsenide.

The substrate of the invention is advantageously bulk, but it can also be multilayer, for example comprising silicon with a layer of oxide. Moreover, it is preferably chosen with low acoustic losses at said resonance frequencies Fi.

According to a variant of the invention, the piezoelectric layer is of AlN, or of $LiNbO_3$.

According to a variant of the invention, the basic mirror structure comprises an alternation of layers of $SiO_2$ and of AlN.

Another subject of the present invention is a method for producing an HBAR resonator comprising, on a substrate, a piezoelectric transducer, said transducer comprising at least one piezoelectric layer, at least two series of electrodes and exhibiting resonance frequencies Fi corresponding to wavelengths λi, characterized in that it comprises the following steps:
the production, on the substrate, of an amplification structure comprising at least one resonant cavity suitable for mechanically resonating at at least one of the resonance frequencies Fi of said transducer corresponding to said wavelength λi;
the production of said transducer in such a way that it is arranged on the surface of said cavity.

According to a variant of the invention, the production of the resonant cavity comprises:
the deposition of a layer of thickness equal to nλi/2, with n being a non-zero integer, on the surface of said substrate;
the production of said transducer on the surface of said cavity.

According to a variant of the invention, the method comprises the production of at least one mirror reflecting at the frequency Fi, in contact with the layer of thickness equal to nλi/2.

According to a variant of the invention, the method comprises the production of said piezoelectric transducer on a host substrate and is characterized in that it comprises the following steps:
the production of a first part of a resonant cavity on the surface of a donor substrate made of piezoelectric material;
the production of a second part of said resonant cavity on the surface of a host substrate;
the bonding of the first and second parts of the resonant cavity so as to define a single resonant cavity at the frequency Fi;
an operation of delimiting a layer of material in said donor substrate so as to obtain said layer of piezoelectric material;
the production of at least one series of electrodes on the surface of said separate piezoelectric layer.

According to a variant of the invention, the first and second parts being half-cavities, each of these half-cavities comprises the deposition of a layer of thickness equal to nλi/4 with n being a non-zero integer.

According to a variant of the invention, the operation of delimiting a layer of material in said donor substrate comprises:
the production of an embrittled region in said substrate so as to delimit, in said substrate, said piezoelectric layer;
the separation of said piezoelectric layer from said donor substrate.

According to a variant of the invention, the production of an embrittled region in said substrate is performed by implantation.

According to a variant of the invention, the operation of delimiting a layer of material in said donor substrate comprises an operation of thinning said donor substrate.

According to a variant of the invention, the donor and host substrates are of $LiNbO_3$.

According to a variant of the invention, the bonding of the two half-cavities is a molecular bonding.

According to a variant of the invention, the method also comprises a preliminary operation of producing a metallic contact layer on the surface of said host substrate.

According to a variant of the invention, the production of the piezoelectric transducer comprises:
the production, in a plate of piezoelectric material, of mirrors reflecting at the frequency Fi;
said mirrors being buried under a thickness of the piezoelectric plate defining the piezoelectric layer of said transducer and defining between them a resonant cavity comprising a piezoelectric layer of thickness equal to nλi/2 with n being a non-zero integer;
the production of series of electrodes on said transducer.

According to a variant of the invention, the piezoelectric material of the plate is of lithium niobate.

According to a variant of the invention, the mirrors are produced by implanting atoms or ions at different energies so as to adjust the depth of implantation.

According to a variant of the invention, the production of the amplification structure comprises the production of a stack of buried layers of different porosities, so as to form a resonant cavity on the surface of said substrate.

According to a variant of the invention, the method also comprises the production of a top layer making it possible to fill the porosity of said stack of buried layers of different porosities, situated between the layers of different porosities and said transducer.

According to a variant of the invention, the production of said stack of buried layers of different porosities is performed by electrochemical etching of the substrate under variable current intensity.

BRIEF DESCRIPTION OF THE DRAWINGS

The invention will be better understood and other advantages will become apparent on reading the following description, given as a nonlimiting example, and from the appended figures in which.

DETAILED DESCRIPTION

The present invention offers the advantage of making it possible to increase the amplitude of one or more resonance peaks, compared to that of a conventional HBAR resonator consisting only of a transducer and a substrate. Moreover, it also allows for a modal selection, by manipulating the envelope of the resonance peaks so as to make it as narrow as possible and consequently attenuate the adjacent resonance peaks. Since these effects are obtained only by a modification of the resonator structure, the latter does not result in a degradation of the quality factors that is as great as that obtained by the addition of external filters. Moreover, it is compatible with some of the HBAR resonator enhancements known to the person skilled in the art which can advantageously complement it: temperature compensation, quadripole components to produce a component having a differential architecture as described in the patent application FR 2 938 136 by D. Gachon and S. Ballandras, entitled *Eléments de filtres par couplage transverse sur structures résonantes á ondes de volume á résonances harmoniques multiple* [Elements of filters by transverse coupling on bulk wave resonant structures with multiple harmonic resonances], thinning of the substrate, etc. Finally, it is applicable to virtually any type of combination of substrate and piezoelectric material.

Figure 1:
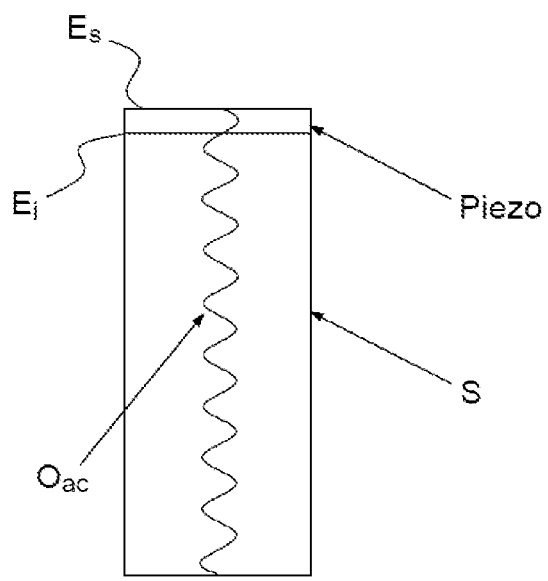
FIG. 1 illustrates the diagram of an HBAR resonator of $LiNbO_3/LiNbO_3$ type.
Figure 2:
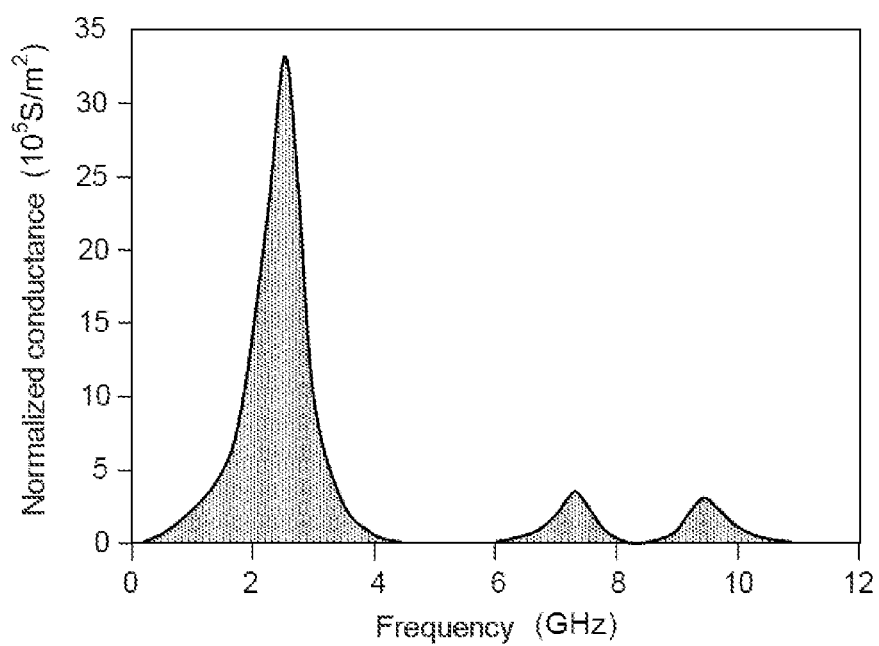
FIG. 2 illustrates the electrical response of an AlN/silicon HBAR resonator.
Figure 3A:
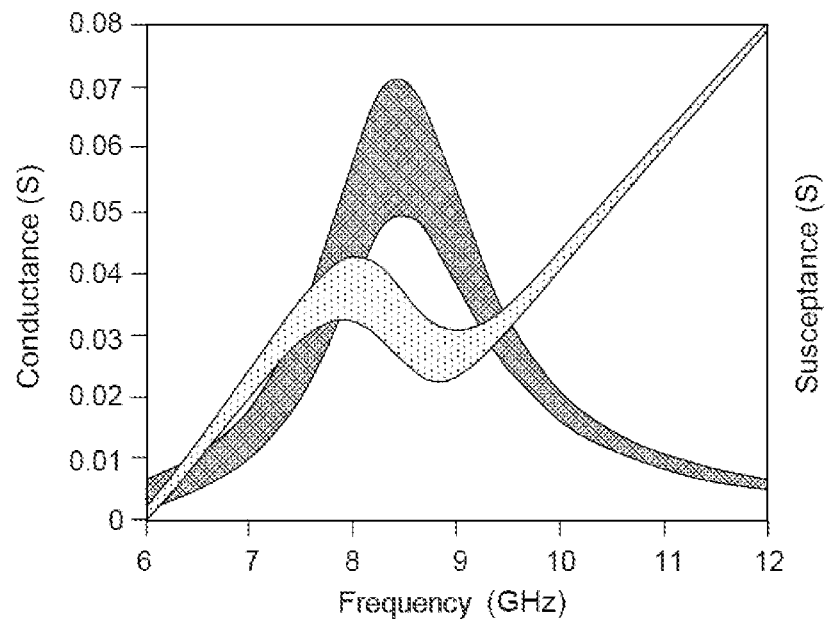
FIGS. 3a and 3b illustrate the effect of the thinning of the substrate on an AlN/sapphire HBAR resonator by showing the electrical responses for a substrate of 400 μm and of 25 μm.
Figure 3B:
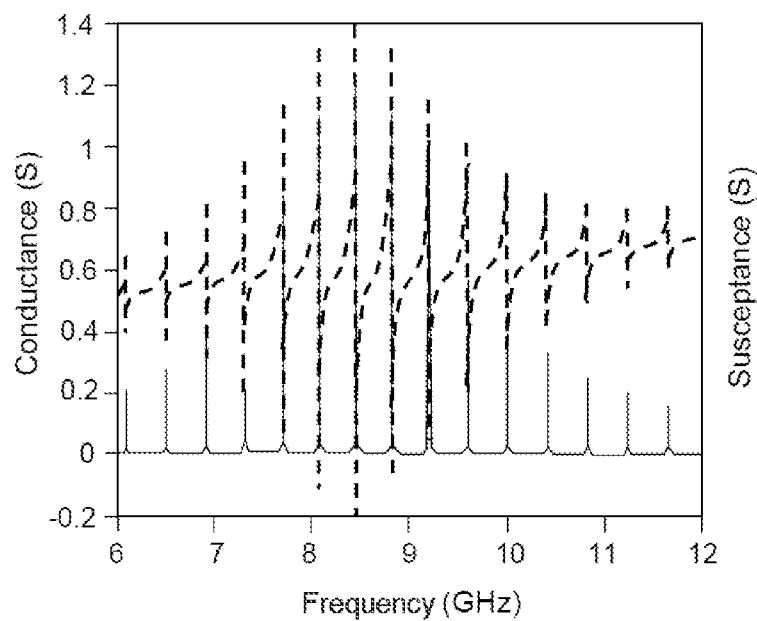
Figure 4:
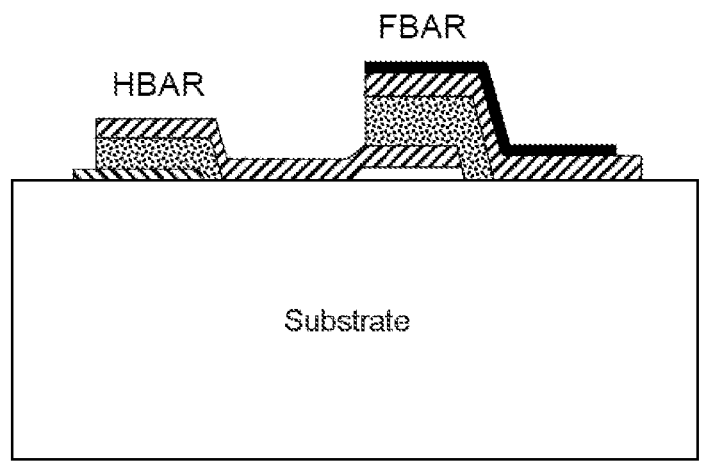
FIG. 4 illustrates a cross-sectional diagram of HBAR resonator and FBAR resonator integration contained in the bandpass filter.
Figure 5:
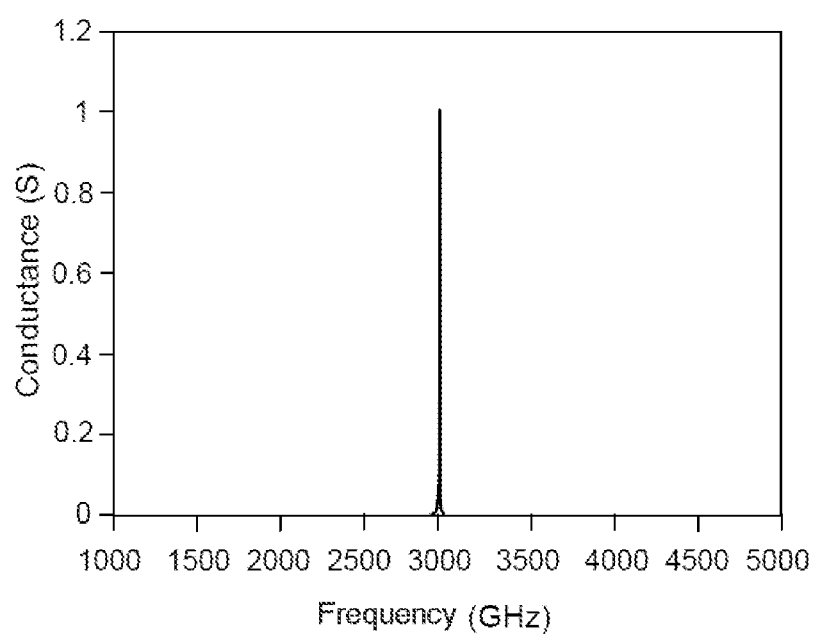
FIG. 5 illustrates the electrical response of the Mo/AlN/Al transducer considered alone.

Example of Production:

An exemplary resonator according to the present invention comprises a 1 μm thin film of aluminium nitride (AlN) as piezoelectric layer, arranged between a 250 nm bottom electrode of molybdenum and a 250 nm top electrode of aluminium. Such a structure exhibits an electrical response in impedance such as that represented in FIG. 5: a resonance clearly defined at 2950 MHz. This electrical response can equally be obtained by a Mason model (J. F. Rosenbaum, *Bulk Acoustic Wave Theory and Devices*, Artech House, Boston, 1945), and by other digital models such as the reflection matrix method (A. Reinhardt, T. Pastureaud, S. Ballandras and V. Laude, *Scattering matrix method for modelling acoustic waves in piezoelectric, fluid and metallic multilayers*, Journ. Appl. Phys. Vol. 94, No. 10, p. 6923-6931 (2003)).

Figure 6:
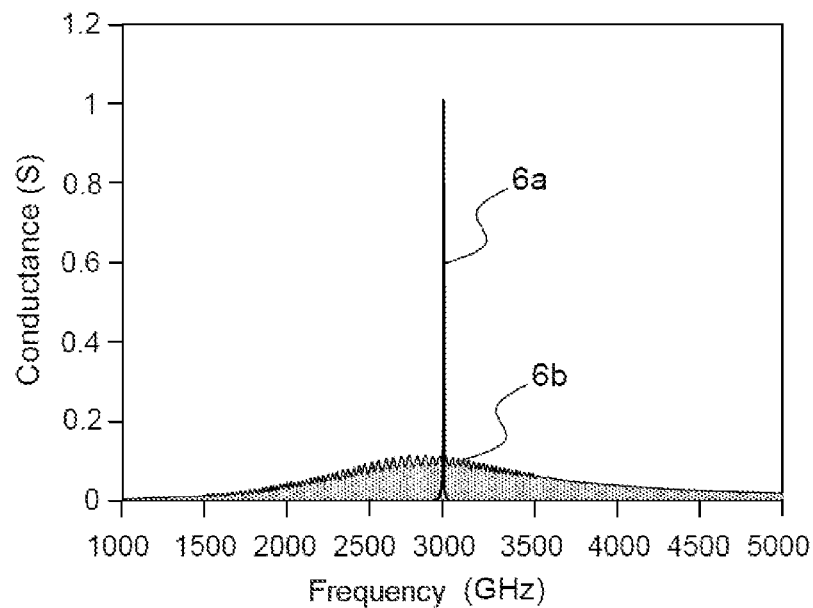
FIG. 6 illustrates the electrical response of a sapphire/Mo/AlN/Al HBAR and that of the transducer alone indicated for reference.

If we now consider the response of an HBAR resonator formed from the preceding stack produced on a sapphire (so-called C-cut, for example) substrate 1 mm thick, the electrical response represented in FIG. 6 is obtained.

The curve 6a relates to the electrical response of a transducer alone.

The curve 6b relates to the electrical response of a sapphire/Mo/AlN/Al HBAR.

This is made up of a large number of resonances evenly spaced apart by approximately 5.5 MHz. Each of these peaks exhibits a width at mid-height of the order of 100 kHz, which is representative of quality factors of the order of 37 000. The amplitude of these resonances exhibits an envelope which is maximal in the region of 2.7 GHz, relatively close to the resonance frequency of the transducer alone (the offset between these two frequencies being due to an offset of the theoretical reflection plane relative to the bottom electrode/substrate interface in the presence of a substrate).

Figure 7:
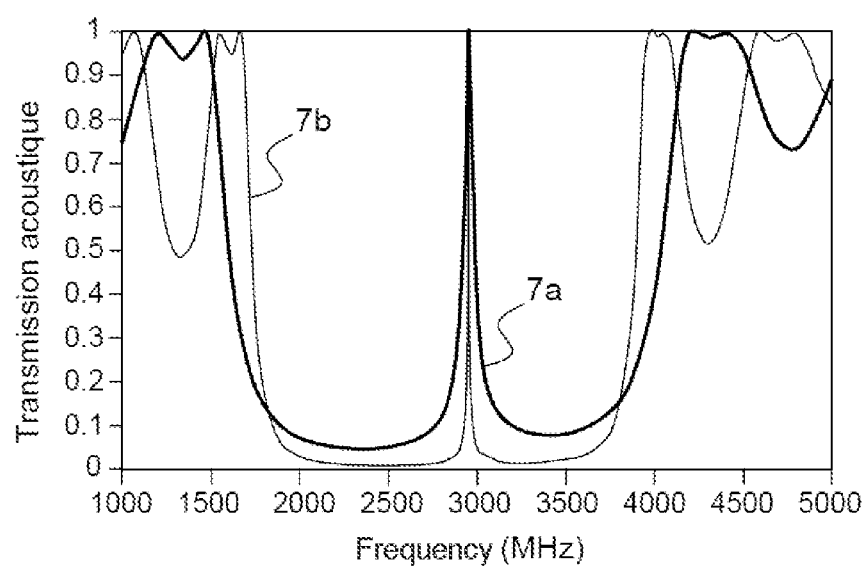
FIG. 7 illustrates the transmission spectrum of acoustic microcavities consisting of alternations of layers of $SiO_2$ and of AlN: the AlN microcavity surrounded by partial Bragg mirrors consisting of 3 or 5 quarter-wave layers.
Figure 8A:
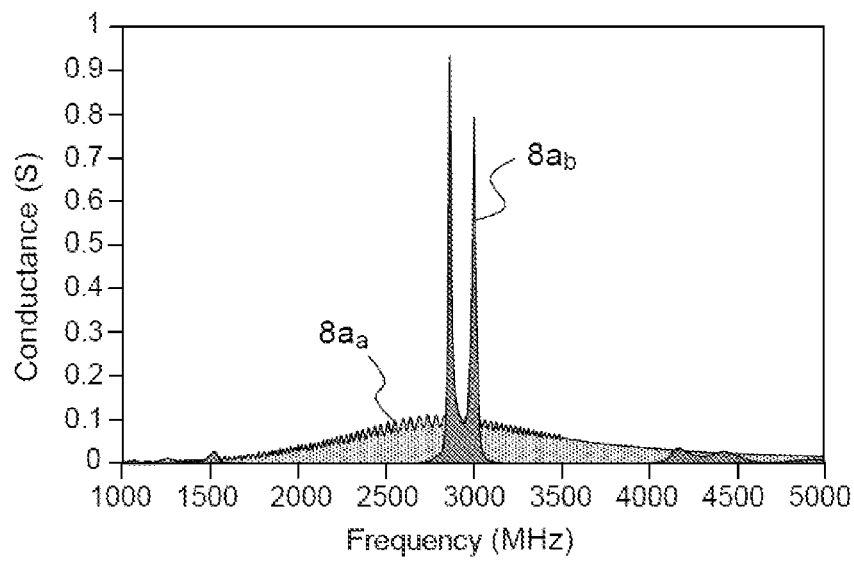
FIGS. 8a to 8d illustrate the conductance spectra obtained in the case of a cavity delimited by mirrors with 3 and with 5 layers and enlargements.
Figure 8B:
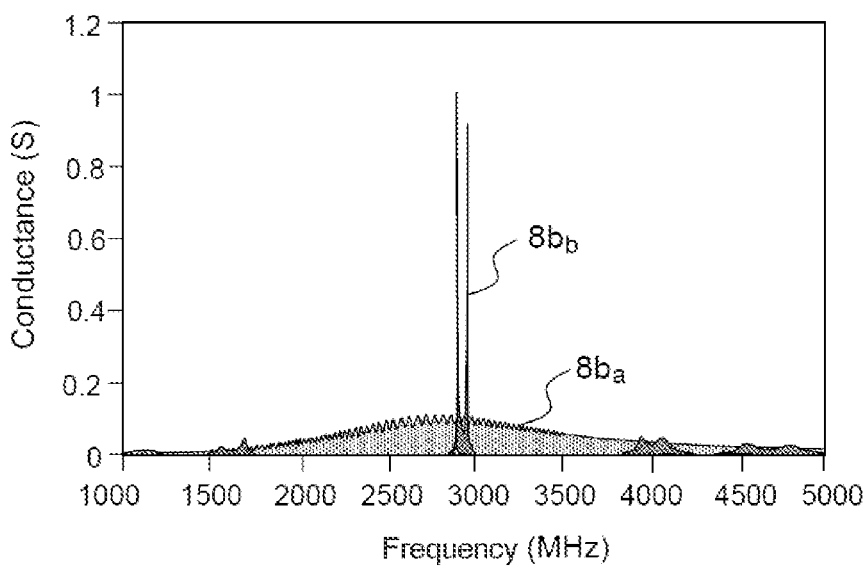
Figure 8C:
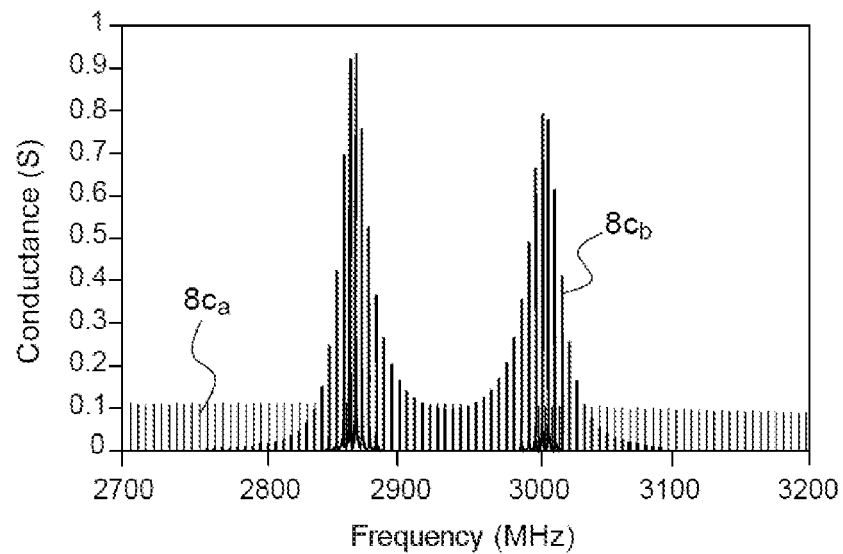
Figure 8D:
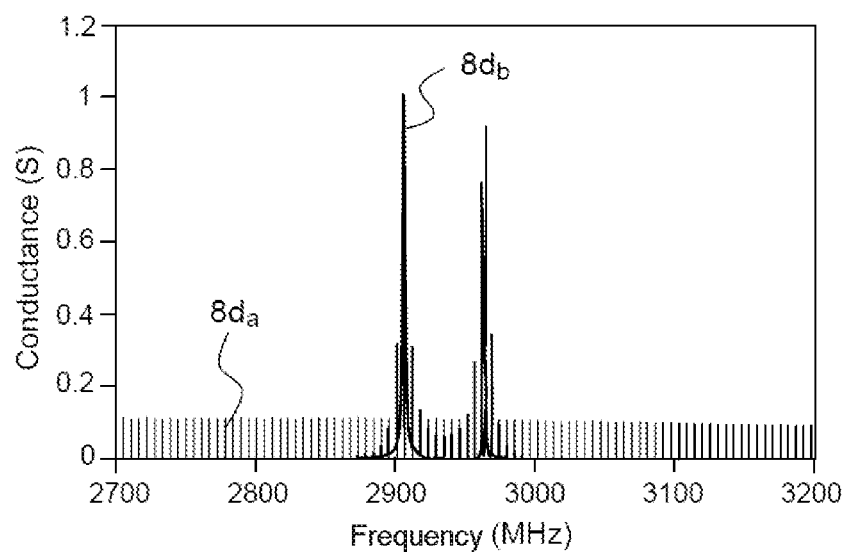

Now considering a resonant microcavity structure consisting of a half-wave layer of AlN bracketed by two partial Bragg mirrors consisting of quarter-wave layers of SiO$_2$ and AlN. For a frequency of 2950 MHz, the thicknesses of the quarter-wave layers of SiO$_2$ and of AlN are respectively 560 nm and 940 nm, and the half-wave layer of AlN is 1.8 μm thick. FIG. 7 shows the spectrum of the acoustic transmission through stacks of this type for partial Bragg mirrors consisting of three quarter-wave layers (curve 7a) and five quarter-wave layers (curve 7b). These spectra, still being able to be calculated by using a Mason model or a reflection matrix model, all exhibit a strong peak centred on 2.7 GHz, corresponding to the resonance frequency of this cavity. At this frequency, the transmission close to 1 indicates that the structure is virtually acoustically "invisible": the acoustic waves can therefore freely be propagated from the transducer to the substrate: the latter is therefore exploited for the acoustic resonance. Around this frequency, the cavity exhibits a very low transmission coefficient, and therefore acts as an insulator, limiting the transmission of the waves from the transducer to the substrate. In practice, the latter will be "hidden", and is therefore involved not at all, or very little, in the electrical response. It can also be noted that the greater the number of layers in the partial Bragg mirrors, the more pronounced the fineness of the resonance of the cavity: the frequency range where the latter is passing is therefore greatly reduced.

According to the present invention, these microcavity structures are inserted between the transducer on the one hand and the substrate on the other hand. FIGS. 8a to 8d show the conductance spectra obtained in the case of resonators and of a cavity delimited by mirrors with three and five layers.

The curves 8$a_a$ and 8$a_b$ relate to the responses of HBAR resonators alone and HBAR resonators with cavity delimited by Bragg mirrors with three layers.

The curves 8$b_a$ and 8$b_b$ relate to the responses of HBAR resonators alone and HBAR resonators with cavity delimited by Bragg mirrors with five layers with detail of the responses around the frequency of interest.

The curves 8$c_a$ and 8$c_b$ relate to the enlarged responses of HBAR resonators alone and HBAR resonators with cavity delimited by Bragg mirrors with three layers.

The curves 8$d_a$ and 8$d_b$ relate to the enlarged responses of HBAR resonators alone and HBAR resonators with cavity delimited by Bragg mirrors with five layers with detail of the responses around the frequency of interest.

As might be expected, the envelope of the response exhibits a maximum around the resonance of the piezoelectric layer, where its amplitude is greatly increased relative to the response of a conventional HBAR. Furthermore, only a few resonances reach greatly elevated levels. On the other hand, an evaluation of the quality factors shows that the latter are reduced to 5000 for the structure with mirrors with three layers and to 2000 for the structure with mirrors with five layers. This effect is due to a high amplitude of the acoustic fields in the layers of the microcavity and of the resonator, which have much greater acoustic losses than those of the substrate.

Figure 9:
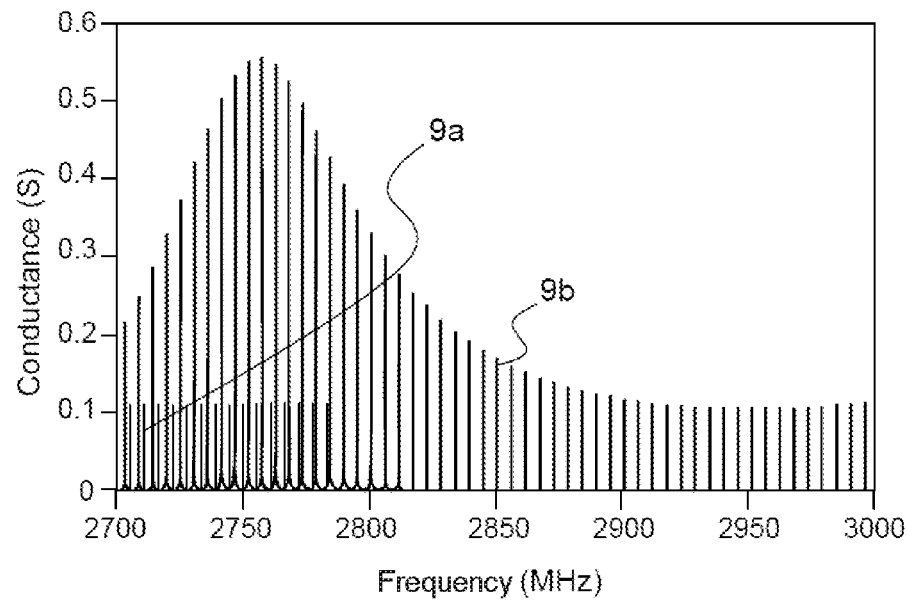
FIG. 9 illustrates the conductance spectrum for a microcavity structure having partial Bragg mirrors with a single quarter-wave layer of SiO$_2$.

The case described above is an extreme case of modal separation, but which, on the other hand, presents a strong reduction of the quality factor of the resonances. In practice, it may be advantageous to reduce the number of layers present in the stack in order to find a better trade-off between modal selection and quality factor. For example, if only single quarter-wave layers are used as partial Bragg mirror surrounding a half-wave layer of AlN, the response represented in FIG. 9 is obtained.

The curve 9a relates to the response of an HBAR alone, the curve 9b relating to the response of an HBAR with a microcavity structure having partial Bragg mirrors with a single quarter-wave layer of $SiO_2$.

The amplitude of the conductance peaks has dropped, just as the envelope shows a more flared profile. However, the resonance closest to 2750 MHz exhibits a quality factor of the order of 18400, which is considerably more than in the preceding two configurations.

The present invention has been explained above in its general principles on the basis of a few examples but can be declined by varying the thicknesses of the layers, their number and their nature in order to arrive at modal selection/quality factor trade-offs that satisfy the particular application constraints.

Figure 10:
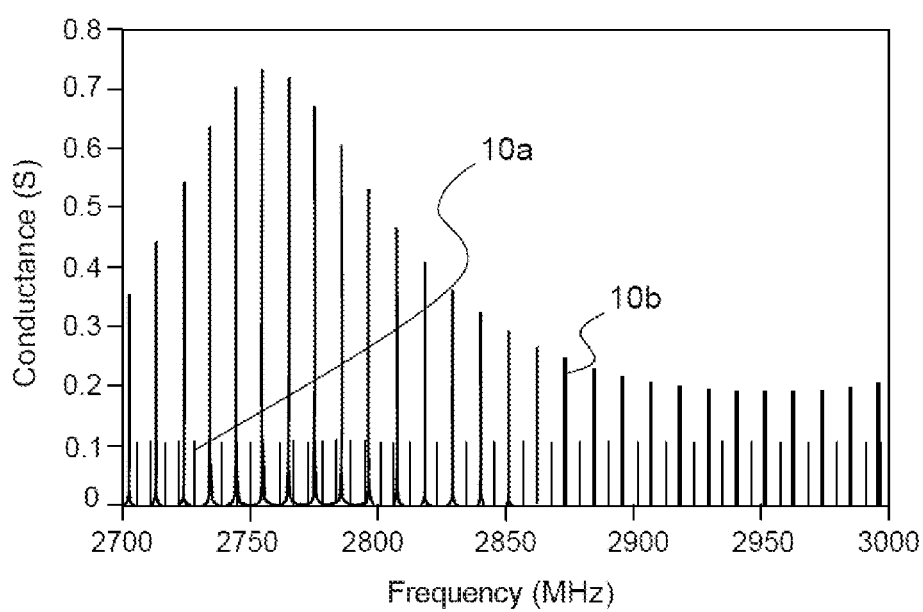
FIG. 10 illustrates the conductance spectrum for a microcavity structure having partial Bragg mirrors with a single quarter-wave layer of SiO$_2$ and a substrate 500 μm thick.

Moreover, this dimensioning does not preclude the use of other approaches already known. For example, it is possible to take up the last example, but by considering a substrate 500 μm thick instead of a 1 mm substrate. In this case, the spacing between each peak is doubled, which leads to the response given in FIG. 10.

The curve 10a relates to the response with an HBAR alone, the curve 10b relating to an HBAR with a microcavity structure having partial Bragg mirrors with a single quarter-wave layer of $SiO_2$ and a substrate 500 μm thick.

This enables this peak to stand out a little better in amplitude even though its quality factor is reduced to 14000. On this basis, it would also be possible to replace resonators with quadripole structures (as described in the patent application FR 2 938 136), and to use the layers of $SiO_2$ of the microcavity for temperature compensation purposes.

First Example of Production of an HBAR Resonator of the Invention Comprising an AlN Resonator on a Sapphire Substrate:

This resonator uses a transducer of AlN produced on a C-cut sapphire substrate. Between the two, an $SiO_2$/AlN/$SiO_2$ microcavity is inserted.

Figure 12A:
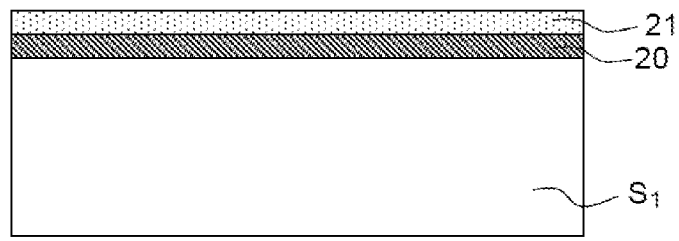
FIGS. 12a to 12f illustrate a second exemplary method for producing an HBAR resonator according to the invention.

According to a first series of steps illustrated in FIG. 12a, a substrate S is cleaned, then a layer 10 of $SiO_2$ (for example 560 nm) is deposited by PECVD (Plasma Enhanced Chemical Vapour Deposition) at 400° C., followed by a mechano-chemical polishing operation in order to smooth the surface. A layer 11, of AlN, is then deposited by reactive cathodic sputtering on an aluminium target in the presence of nitrogen (for example 960 nm thick). A second layer 12, of $SiO_2$, is then deposited by PECVD, with the same thickness as the first layer 10.

According to a second step, an adhesive layer is deposited followed by a layer 13 of molybdenum 200 nm thick intended to produce the bottom electrode of the resonator, by cathodic sputtering.

Figure 11A:
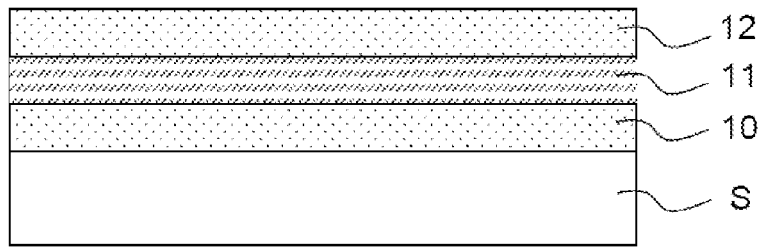
FIGS. 11a to 11h illustrate a first exemplary method for producing an HBAR resonator according to the invention.
Figure 11B:
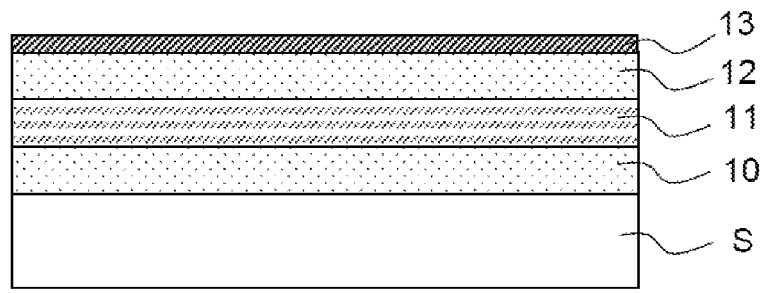
Figure 11C:
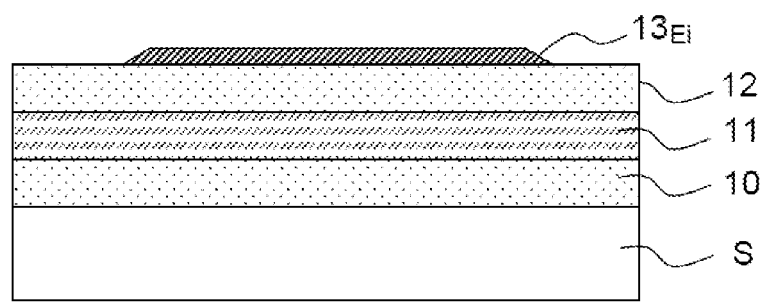

Resin coating, lithography and then creep at 200° C. for 15 minutes are then carried out in a third step illustrated in FIG. 11c. This is then followed by fluorinated dry etching by RIE of the molybdenum and then resin removal, in order to define the electrode $13_{Ei}$.

Figure 11D:
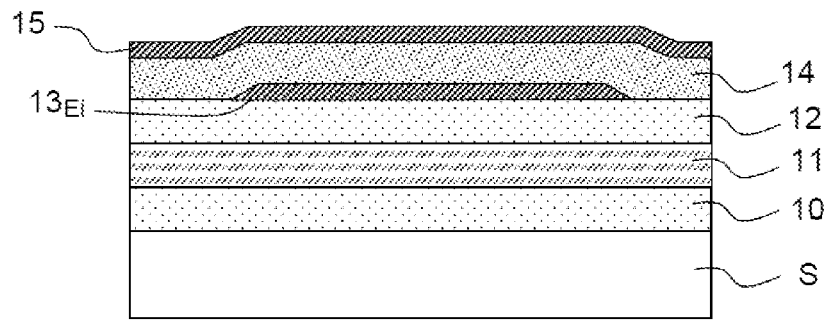

In a fourth step, illustrated in FIG. 11d, a layer 14 of AlN 1 μm thick is deposited, by pulsed DC reactive cathodic sputtering, at a temperature of 300° C., followed by the deposition of a layer 15 of molybdenum, 200 nm thick, by cathodic sputtering.

Figure 11E:
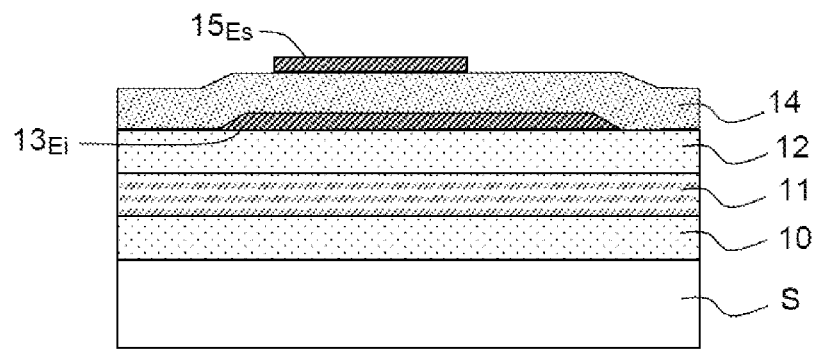

Resin coating, a lithography operation, then fluorinated dry etching of molybdenum and resin removal are then carried out in a fifth step illustrated in FIG. 11e to define the top electrode $15_{Es}$.

Figure 11F:
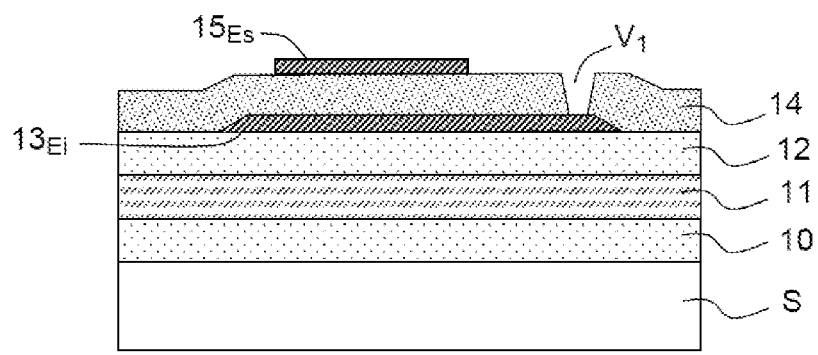

In a sixth step illustrated in FIG. 11f, a via $V_1$ is produced, by resin coating and lithography, then wet etching of the AlN in a bath of $H_3PO_4$ at 130° C. Rinsing and resin removal operations are then carried out.

Figure 11G:
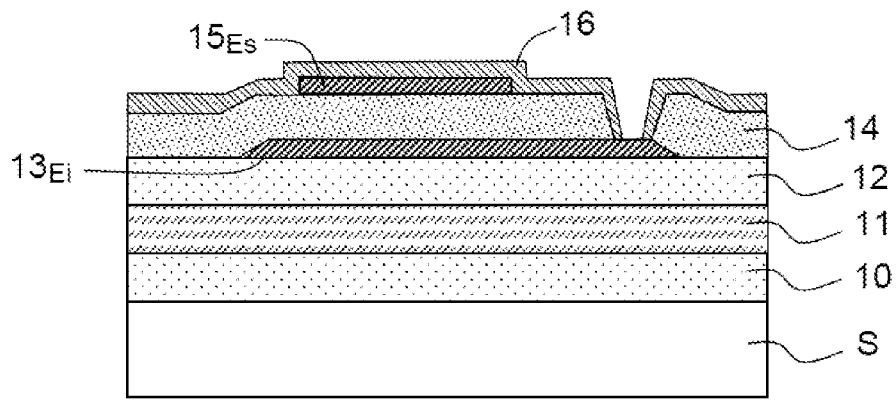

In a seventh step illustrated in FIG. 11g, a layer 16 of silicon nitride (SiN) is deposited by PECVD (200 nm), followed by resin coating and lithography operations. Dry etching and resin removal operations are then carried out.

Figure 11H:
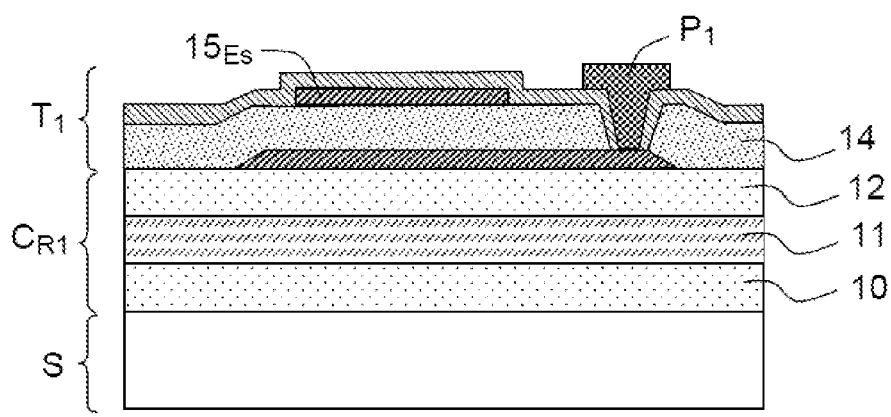

In an eighth step illustrated in FIG. 11h, aluminium-copper 1 μm thick is deposited, by cathodic sputtering. Resin coating and lithography are then carried out followed by chlorinated dry etching, rinsing and resin removal operations. A contact bump $P_1$ is thus defined.

It should be noted that it is possible to use the presence of layers of $SiO_2$ for component temperature compensation purposes. In its simplest form, the resonant cavity could even be limited to a single layer of $SiO_2$ having a thickness equal to a multiple of a half-wavelength. In this precise case, this criterion has added to it also that of managing to partially compensate the resonator in temperature.

FIG. 11h shows the HBAR resonator structure according to the invention comprising a substrate region S, a resonant cavity region $C_{R1}$ and a transduction region $T_1$.

Second Example of Production of an HBAR Resonator of the Invention Comprising an $LiNbO_3$/$LiNbO_3$ Resonator Using a Thin Piezoelectric Layer Transfer:

The present invention can also be used for the production of resonators using a piezoelectric layer of lithium niobate. Compared to the preceding embodiment using a layer of AlN, X-cut lithium niobate allows for the use of bulk shear waves, which are less subject to losses by radiation in the air. In order to simplify the production method, these monocrystalline layers of $LiNbO_3$ are generally transferred onto substrates of the same material. The drawback is that the X cut of the $LiNbO_3$ in practice exhibits two piezoelectrically coupled shear waves, which can lead, if precautions are not taken, to spectral responses exhibiting two series of periodicities, one for each polarization, which doubles the number of resonances of the component. It has nevertheless been shown that, by a deliberate de-orientation of the crystalline axes of the transferred layer and of the substrate, it is possible to exploit mode conversion effects between the two layers so that only one of these two shear waves remains in practice (as described in the paper by M. Pijolat, D. Mercier, A. Reinhardt, E. Defaÿ, C. Deguet, M. Aïd, J. S. Moulet, B. Ghyselen, S. Ballandras, entitled *Mode conversion in high overtone bulk acoustic wave resonators*, Proceedings of the 2009 International Frequency Control Symposium, p. 290-294 (2009)).

One of the methods that can be used to obtain such resonators consists in employing the smart cut method. This method uses a layer of silicon oxide to bond the transferred layer onto a host substrate. Normally, this layer of oxide is aimed to be thin, in order for it to disturb the electrical response of the resonator as little as possible. In the present example, the Applicant seeks, on the contrary, to exploit it and make a microcavity of it, dimensioned so that its thickness is a quarter-wavelength of the shear wave used, at the desired frequency.

An example of such a method is illustrated in FIGS. 12a to 12f.

In a first step illustrated in FIG. 12a, the substrate $S_1$, called "donor", is cleaned, followed by the deposition of a layer 20 of molybdenum 200 nm thick by cathodic sputtering. A layer of silicon oxide 21 is then deposited by PECVD at low temperature (100 nm thick).

Figure 12B:
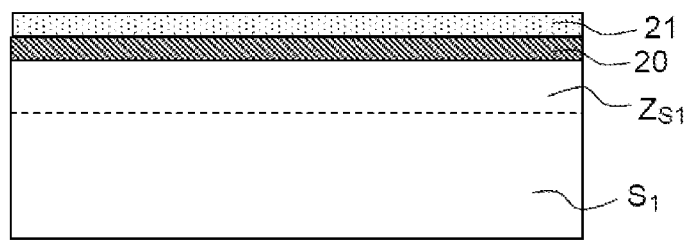

The ion implantation of helium atoms is then performed in a second step, illustrated in FIG. 12b, in order to create an area of defects to the desired depth, so as to define an insulated region $Z_{S1}$.

Figure 12C:
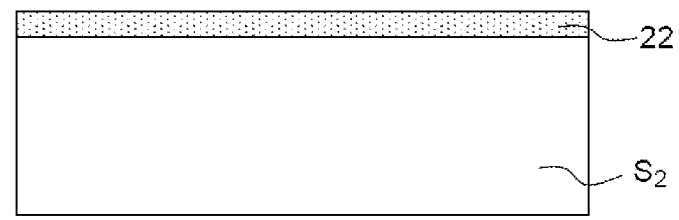

In a third step, illustrated in FIG. 12c, a layer 22 of silicon oxide is deposited on a so-called "host" substrate $S_2$ (thickness: 3.9 μm, or a half-wavelength) by PECVD at low temperature.

Figure 12D:
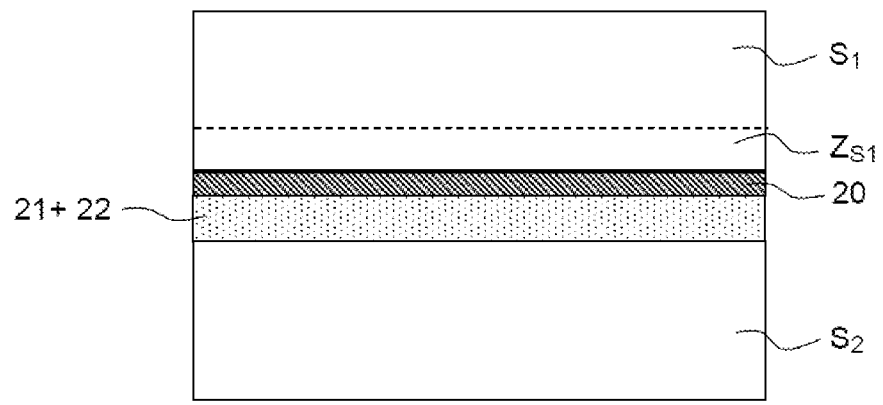

An operation of molecular bonding of the two substrates at the level of the layers of silicon oxide is then carried out in a fourth step, illustrated in FIG. 12d, so as to form an angle of 20° between the flats of the two substrates.

Figure 12E:
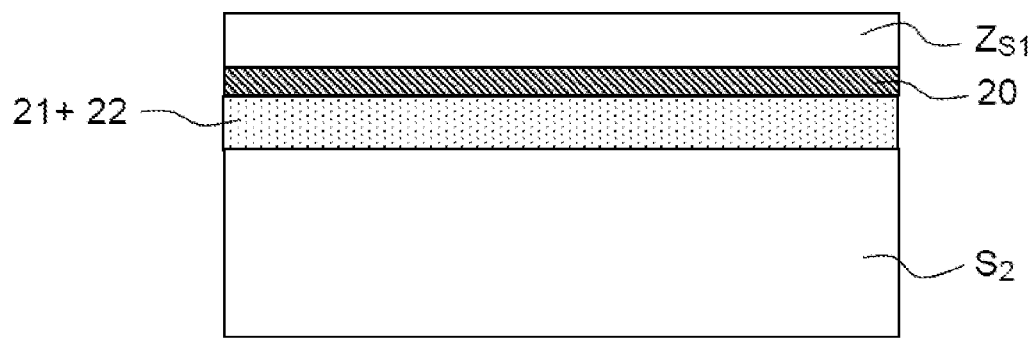

A bake operation to begin defects leading to the separation of the layer transferred from the "donor" substrate is carried out in a fifth step illustrated in FIG. 12e. There is then a bake operation to consolidate the bonding followed by a mechano-chemical polishing operation to eliminate the damaged layer of LiNbO$_3$, restore a suitable roughness (of the order of 1 nm rms), and adjust the thickness of the transferred layer.

Figure 12F:
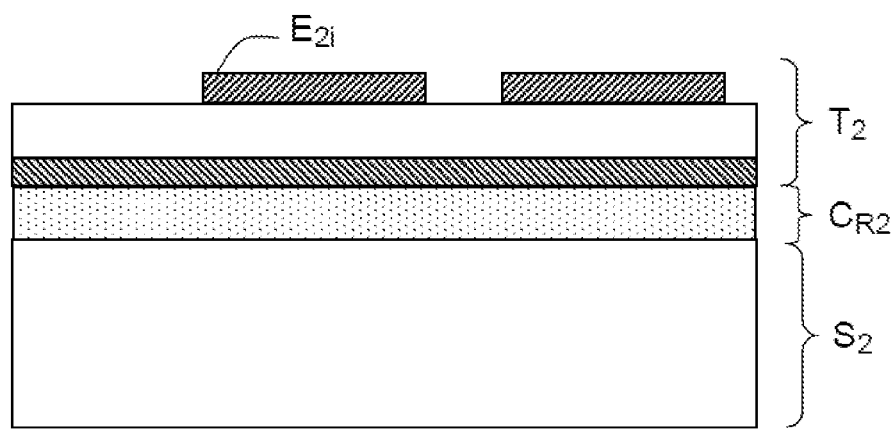

In a sixth step illustrated in FIG. 12f, a layer of aluminium is deposited to a thickness of 200 nm by cathodic sputtering, followed by photolithography, then definition of the top electrode $E_{2i}$, by wet etching and resin removal. FIG. 12f highlights the HBAR resonator structure according to the invention comprising a substrate region $S_2$, a resonant cavity region $C_R{}^2$ and a transduction region $T_2$.

Third Example of Production of an HBAR Resonator of the Invention, Based on LiNbO$_3$ and Using the Formation of Buried Monolithic Acoustic Structures:

By going further than the preceding embodiment, it is possible to directly produce the structure in a monolithic manner by using the property of the lithium niobate to react with hydrogen atoms via the so-called proton exchange reaction and form a new phase exhibiting acoustic characteristics different from the original material.

The Applicant has described, in a previous patent application FR 10 58402, that this property can make it possible to produce resonators. One of the embodiments already presented the production of a resonator on a Bragg mirror. This embodiment is taken up again to form a complete buried microcavity situated under a resonator with lateral electrical excitation. An exemplary method is described hereinbelow with the help of FIGS. 13a to 13d.

Figure 13A:
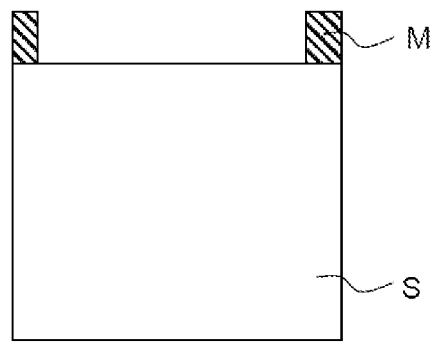
FIGS. 13a to 13d illustrate a third exemplary method for producing an HBAR resonator according to the invention.

According to a first step, illustrated in FIG. 13a, a substrate S, of lithium niobate, is cleaned followed by a photolithography operation to define a mask for the implantation M.

Figure 13B:
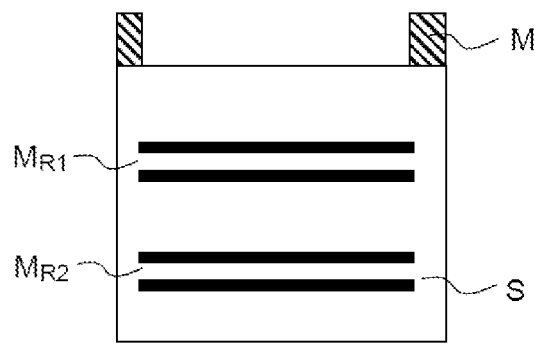

During a second step illustrated in FIG. 13b, successive hydrogen implantations are carried out, by decreasing energy, in order to form a quasi-periodic implantation profile. This profile thus makes it possible to generate two sets of acoustic mirrors $M_{R1}$ and $M_{R2}$ separated by a microcavity.

Figure 13C:
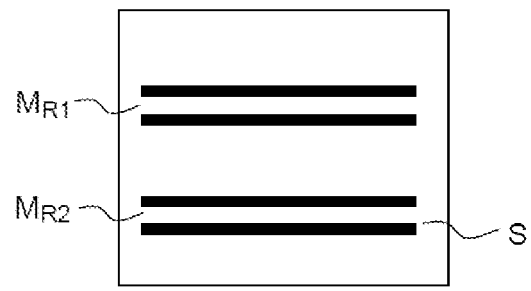

As illustrated in FIG. 13c, the mask M is then removed followed by a homogenizing bake operation.

Figure 13D:
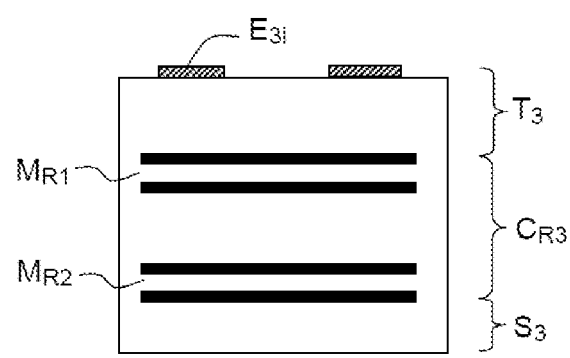

During a subsequent step, illustrated in FIG. 13d, the deposition, photolithography, etching and resin removal operations are carried out to define the top electrodes $E_{3i}$, for example made of aluminium. FIG. 13d highlights the HBAR resonator structure according to the invention comprising a substrate region $S_3$, a resonant cavity region $C_{R3}$ and a transduction region $T_3$.

Fourth Example of Production of an HBAR Resonator of the Invention, Based on AlN on Silicon Using a Microcavity Produced in Porous Silicon:

According to this fourth embodiment, the structure can be produced in a monolithic manner, in a semiconductor material that can be made porous by an electrochemical attack. The most conventional example is silicon rendered porous by an electrochemical attack in a solution of hydrofluoric acid (HF). It is already known that acoustic mirror structures and microcavities can be produced by this technique, as described in the paper by G. N. Aliev, B. Goller, D. Kovalev and P. A. Snow, entitled *Hypersonic acoustic mirrors and microcavities in porous silicon*, Applied Physics Letters 96, 124101 (2010). It should be noted that other semiconductor substrates, such as GaAs or Ge, can also be made porous by an electrochemical etch, and can be used in a similar manner to produce mirror or acoustic microcavity structures.

Figure 14A:
FIGS. 14a to 14k illustrate a fourth exemplary method for producing an HBAR resonator according to the invention.

Moreover, it is possible to plug the surface pores by a deposition by silicon epitaxy, followed by a thermal oxidation and a planarization in order to reduce the roughness induced by the presence of pores under the surface. From this substrate, it is possible to continue the production of HBAR resonators in a conventional manner. One production method is then as follows:

According to a first step illustrated in FIG. 14a, a substrate S, made of boron-doped silicon (resistivity of 10 to 15 mΩ·cm), is used as a starting point, then cleaned by a bath of RCA type (mixture of deionized water, hydrochloric acid and oxygenated water), followed by a deoxidation operation in a diluted HF solution.

Figure 14B:
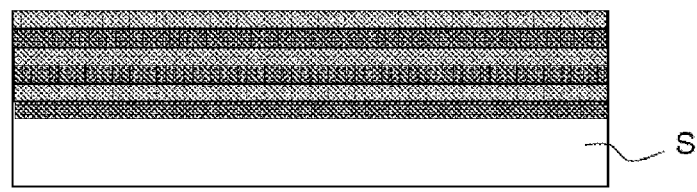

In a second step, illustrated in FIG. 14b, the electrochemical etch is carried out in a 1:1 solution of 49% concentrated HF and ethanol. During the etching, the intensity of the current is varied periodically in time, so as to provide an alternation of six layers of respective porosities $C_{Ri}$ of 47 and 61%. This is followed by continuing with the etching of a layer of 61% porosity etched at double time, then the etching of an alternation of six layers is then repeated.

Figure 14C:
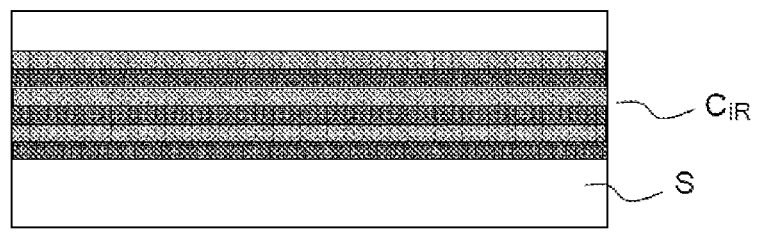

In a third step, illustrated in FIG. 14c, epitaxiated silicon is deposited to a thickness of 500 nm so as to plug the pores.

Figure 14D:
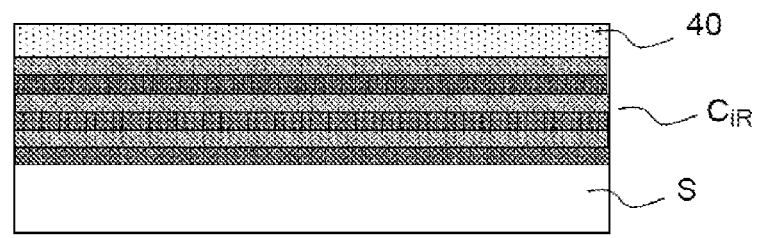

In a fourth step, illustrated in FIG. 14d, a thermal oxidation operation is performed over 200 nm followed by a planarization operation to define the layer of oxide 40.

Figure 14E:
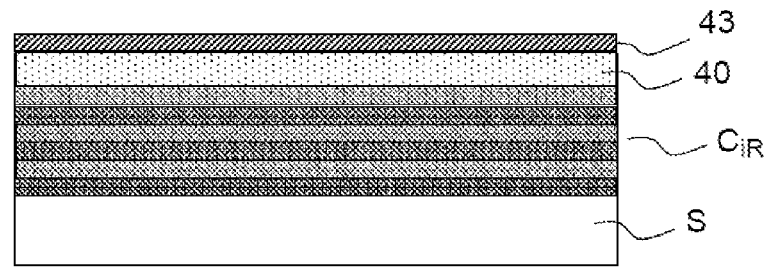

According to a fifth step, illustrated in FIG. 14e, an adhesive layer is deposited followed by the deposition of a layer 43 of molybdenum (200 nm) by cathodic sputtering.

Figure 14F:
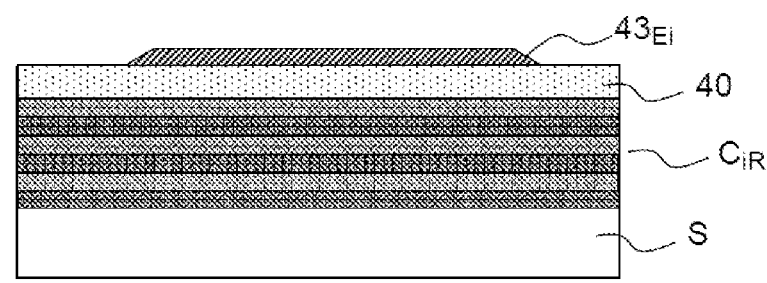

According to a sixth step, illustrated in FIG. 14f, resin coating and lithography operations are carried out, followed by creep at 200° C. during 15 minutes of fluorinated dry etching (RIE) of the Mo, then resin removal so as to define a bottom electrode $43_{Ei}$.

Figure 14G:
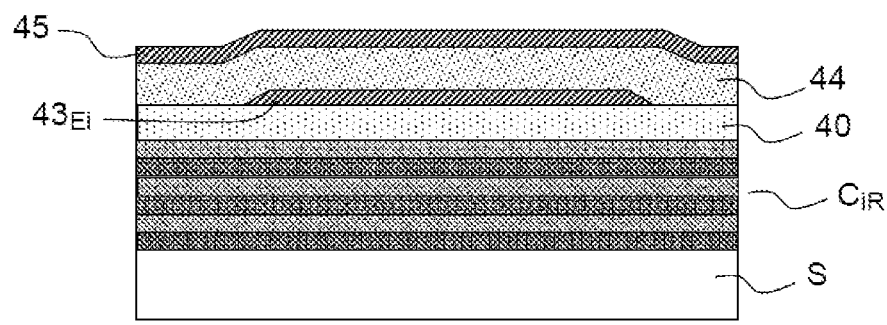

According to a seventh step illustrated in FIG. 14g, a layer 44 of AlN (1 μm) is deposited by pulsed DC reactive cathodic sputtering, at a temperature of 300° C., then a layer 45 of molybdenum Mo (200 nm) is deposited by cathodic sputtering.

Figure 14H:
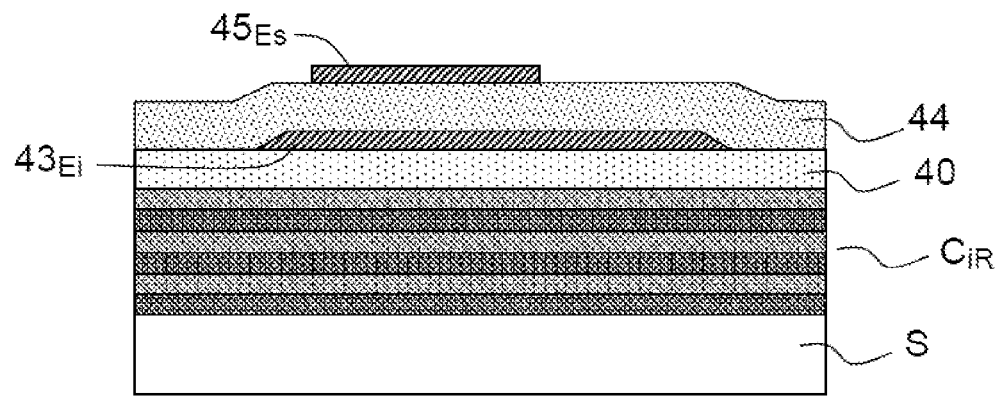

According to an eighth step illustrated in FIG. 14h, the resin coating is carried out together with operations of lithography, fluorinated dry etching of the Mo and resin removal to define the top electrode $45_{Es}$.

Figure 14I:
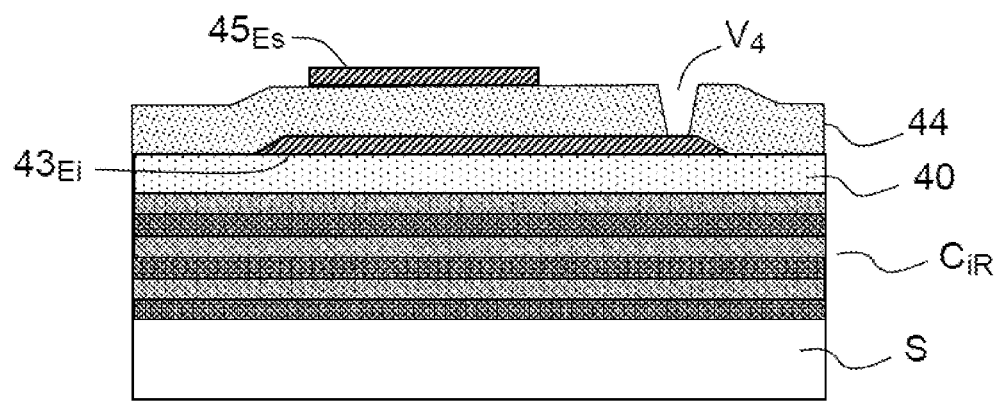

According to a ninth step illustrated in FIG. 14i, the resin coating is carried out together with operations of lithography, wet etching of the AlN in a bath of $H_3PO_4$ at 130° C., rinsing and resin removal to define a via $V_4$.

Figure 14J:
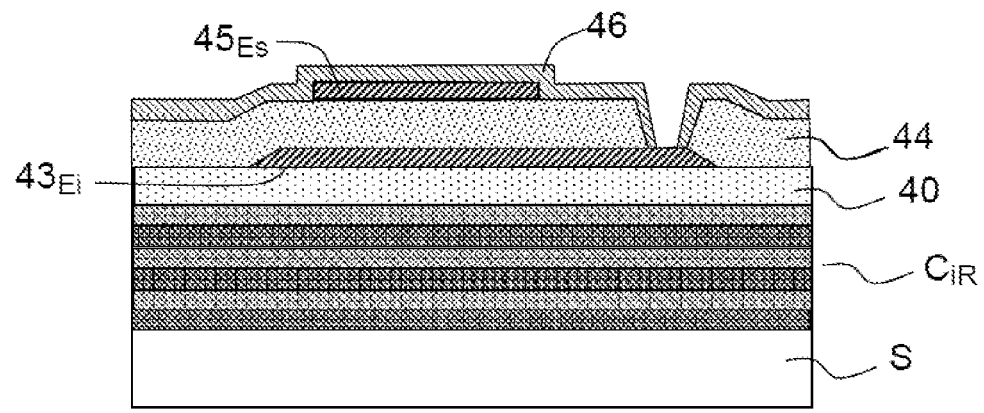

According to a tenth step illustrated in FIG. 14j, a layer 46 of silicon nitride (SiN) is deposited by PECVD (200 nm), followed by resin coating and lithography, and then a dry etching and resin removal operation.

Figure 14K:
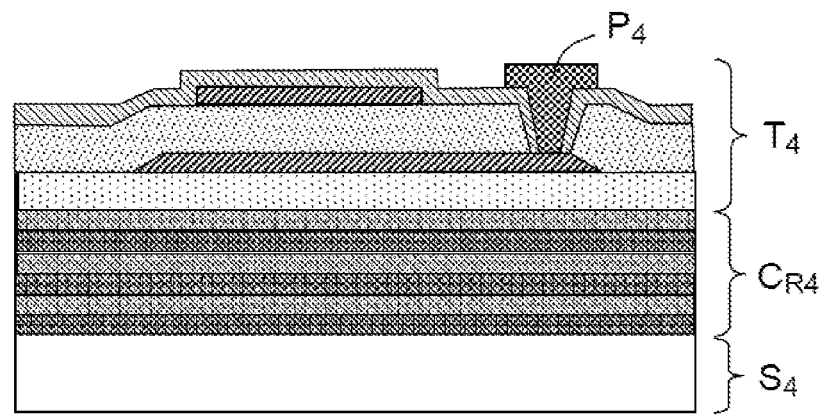

According to an eleventh step illustrated in FIG. 14k, there is then an aluminium-copper deposition (1 μm) by cathodic sputtering followed by resin coating, lithography and chlorinated dry etching, rinsing and resin removal operations so as to define a contact bump $P_4$ making it possible to connect the bottom electrode. FIG. 14k thus highlights the HBAR resonator structure according to the invention comprising a substrate region $S_4$, a resonant cavity region $C_{R4}$ and a transduction region $T_4$.

The invention claimed is:

1. A HBAR resonator, comprising an amplification structure wherein the amplification structure comprises:
   on a substrate, a piezoelectric transducer, said transducer comprising at least one piezoelectric layer and at least two electrodes and exhibiting resonance frequencies Fi corresponding to wavelengths λi; and
   at least one resonant cavity arranged on the substrate between said transducer and said substrate or in said substrate, this amplification structure being suitable for mechanically resonating at at least one of the resonance frequencies Fi of said transducer corresponding to said wavelength λi, so as to amplify the amplitude of the electrical resonance generated at said frequency,
   wherein the resonant cavity is defined as being a single-layer or multilayer structure exhibiting an acoustic transmission spectrum characterized by relatively low levels, being able to be 0.5 or less, and over a wider frequency range bracketing the working frequencies Fi, but with localized transmission peaks at the frequency Fi of interest.

2. The HBAR resonator according to claim 1, in which said resonant cavity has a thickness substantially equal to nλi/2 with n being a non-zero integer.

3. The HBAR resonator according to claim 1, in which the amplification structure additionally comprises at least one basic mirror structure reflecting at said frequency Fi.

4. The HBAR resonator according to claim 1, in which the transducer comprises a plurality of bottom electrodes and a plurality of top electrodes.

5. The HBAR resonator according to claim 1, in which the transducer comprises two top electrodes.

6. The HBAR resonator according to claim 1, in which said resonant cavity comprises a layer of thickness substantially equal to nλi/2 with n being a non-zero integer.

7. The HBAR resonator according to claim 1, in which said resonant cavity is defined in said substrate, and is delimited by basic mirror structures reflecting at said frequency Fi ($M_{R1}$, $M_{R2}$) buried in said substrate, these structures forming part of said resonant cavity.

8. The HBAR resonator according to claim 1, in which the resonant cavity comprises a layer of $SiO_2$.

9. The HBAR resonator according to claim 1, in which said resonant cavity comprises a succession of alternate layers of variable porosity.

10. The HBAR resonator according to claim 1, in which the substrate is made of sapphire, or of quartz, or of lithium niobate, or of lithium tantalate, or of corindon or of silicon, or of germanium or of gallium arsenide.

11. The HBAR resonator according to claim 1, in which the piezoelectric layer is of AlN, or of $LiNbO_3$.

12. The HBAR resonator according to claim 3, in which the basic mirror structure comprises an alternation of layers of $SiO_2$ and of AlN.

* * * * *